(12) United States Patent
Plachy et al.

(10) Patent No.: US 12,257,824 B2
(45) Date of Patent: Mar. 25, 2025

(54) SCREEN PRINTING DEVICE AND METHOD FOR SCREEN PRINTING ONTO SUBSTRATES

(71) Applicant: EKRA Automatisierungssysteme GmbH, Bönnigheim (DE)

(72) Inventors: Franz Plachy, Brackenheim (DE); Lukas Sänger, Backnang (DE); Rainer Voigt, Freiburg (DE)

(73) Assignee: EKRA AUTOMATISIERUNGSSYSTEME GMBH, Bönnigheim (DE)

( * ) Notice: Subject to any disclaimer, the term of this patent is extended or adjusted under 35 U.S.C. 154(b) by 0 days.

(21) Appl. No.: 18/568,419

(22) PCT Filed: Jun. 10, 2022

(86) PCT No.: PCT/EP2022/065877
§ 371 (c)(1),
(2) Date: Dec. 8, 2023

(87) PCT Pub. No.: WO2022/258823
PCT Pub. Date: Dec. 15, 2022

(65) Prior Publication Data
US 2024/0269978 A1  Aug. 15, 2024

(30) Foreign Application Priority Data
Jun. 11, 2021  (DE) ............. 10 2021 205 984.8

(51) Int. Cl.
*B41F 15/08*  (2006.01)
*B41F 15/14*  (2006.01)
(Continued)

(52) U.S. Cl.
CPC .......... *B41F 33/0081* (2013.01); *B41F 15/20* (2013.01); *B41F 15/26* (2013.01); *B41F 15/36* (2013.01); *B41F 15/46* (2013.01)

(58) Field of Classification Search
None
See application file for complete search history.

(56) References Cited

U.S. PATENT DOCUMENTS

| 2002/0020346 A1 | 2/2002 | Doyle et al. |
| 2014/0109779 A1 | 4/2014 | Miyake et al. |

(Continued)

FOREIGN PATENT DOCUMENTS

| DE | 10 2018 205 944 A1 | 10/2019 | |
| GB | 2464969 A * | 5/2010 | .......... B41F 15/0881 |
| IT | UD20090153 A1 | 3/2011 | |

OTHER PUBLICATIONS

International Search Report for corresponding International Application No. PCT/EP2022/065877 mailed Nov. 3, 2022.

(Continued)

*Primary Examiner* — Leslie J Evanisko
(74) *Attorney, Agent, or Firm* — Chrisman Gallo Tochtrop LLC (57) ABSTRACT

The application relates to a printing device for printing onto substrates, in particular solar cells, wafers or printed circuit boards, including a squeegee means and including at least one printing table, wherein the squeegee means is arranged above the printing table, and including at least one conveying means, by means of which a substrate can be transported away in each case to a printing nest below the squeegee direction and away out of the printing nest after the printing process has taken place. It is provided that the printing table has several conveying means, which are arranged side by side and aligned parallel to one another and which each have at least one printing nest, and that the squeegee means has at least one squeegee, which can be moved over each printing nest in order to print successively onto the substrates, which are arranged in the printing nests.

16 Claims, 4 Drawing Sheets

(51) Int. Cl.
*B41F 15/20* (2006.01)
*B41F 15/26* (2006.01)
*B41F 15/36* (2006.01)
*B41F 15/46* (2006.01)
*B41F 33/00* (2006.01)

(56) References Cited

U.S. PATENT DOCUMENTS

2015/0239229 A1* 8/2015 Murakami ......... H05K 13/0465
118/698
2017/0313053 A1* 11/2017 Mantani .................. B41F 15/22
2021/0168941 A1 6/2021 Vegelahn et al.

OTHER PUBLICATIONS

Written Opinion for corresponding International Application No. PCT/EP2022/065877 dated Nov. 3, 2022.
International Preliminary Report on Patentabililty for corresponding International Application No. PCT/EP2022/065877 dated May 9, 2023.
International Preliminary Report on Patentability for corresponding International Application No. PCT/EP2022/065877 dated May 9, 2023.

* cited by examiner

SCREEN PRINTING DEVICE AND METHOD FOR SCREEN PRINTING ONTO SUBSTRATES

FIELD OF THE INVENTION

The invention relates to a printing device for printing onto substrates, in particular solar cells, wafers, printed circuit boards or the like, comprising a squeegee means and comprising at least one printing table, wherein the squeegee means is arranged above the printing table, and comprising at least one conveying means, which is arranged below the printing table and by means of which a substrate can be transported in each case to a printing nest below the squeegee means and away from the printing nest after the printing process has taken place.

The invention furthermore relates to a method for printing onto substrates, in particular wafers, solar cells, printed circuit boards or the like, comprising a squeegee means and comprising at least one printing table, wherein the squeegee means is arranged above the printing table, and wherein a substrate to be printed onto is conveyed onto a printing nest of the printing table, is printed onto, and is subsequently transported away from the printing nest.

BACKGROUND OF THE INVENTION

Printing devices of the above-mentioned type are already known from the prior art. Printing means, which use a squeegee means for printing onto substrates, can be used in a variety of ways. They are in particular used to print electrically conductive conductor tracks onto electrically non-conductive substrates, for example in order to produce printed circuit boards or solar cells or the like. During the squeegee process, a printing compound is initially applied to a printing screen, which lies above the substrate to be printed onto. The printing compound is subsequently pressed through the printing screen onto the substrate by means of a squeegee, which in particular has a squeegee blade. For this purpose, the substrate is optionally raised close to the printing screen in order to set a predetermined off contact distance, thus a predetermined distance between printing screen and the substrate surface to be printed onto. A printing nest is generally used to fix the substrate. A conventional printing device is described, for example, in the the published patent application IT DU20 090 153 A1.

Due to the fact that the printing screen and the substrate have to be firmly assigned to one another for the squeegee process, the squeegee process cannot be accelerated arbitrarily. However, in order to increase the throughput of a printing device of this type, it is known, for example from the published patent application DE 10 2018 205 944 to simultaneously supply several substrates to a printing nest and to print onto them by means of a printing screen, which has a printing pattern for each of the substrates, in one squeegee process.

A printing device comprising a printing screen, which can optionally be assigned to a first or a second printing nest, is known from the published patent application US 2014/109779 A1. The published patent application US 2002/020346 A1 describes a printing device comprising a printing screen, which extends over several printing nests.

BRIEF SUMMARY OF THE INVENTION

The present invention is based on the object of further accelerating the printing process without thereby having to accept quality losses in the print result.

The object on which the invention is based is solved by means of a printing device. The printing device according to the invention has the advantage that a continuous or at least more continuous processing of the substrates takes place by means of the squeegee means without large extra effort, wherein, in spite of a high throughput of substrates, the substrates are not guided out of the printing device in groups but successively, which results in an advantageous processing flow, in particular in a manufacturing line, which connects to the printing device.

The printing device according to the invention is characterized in that the printing table has several conveying means, which are arranged side by side and which each have at least one printing nest, in particular on the printing table, and that the squeegee means has at least one squeegee, which can be moved over each printing nest in order to print successively onto substrates, which are arranged in or on the printing nests. The substrates can be supplied to the printing table and can be removed from the printing table in different ways by means of the several conveying means, so that the supply and removal of the substrates by means of the conveying means can take place independently of one another. The side by side arrangement of the conveying means is to thereby be understood with regard to the conveying direction of the conveying means. Due to this arrangement, the conveying means or the conveying paths thereof lie one behind the other with regard to the direction of movement of the squeegee means or of the squeegee, respectively. A substrate can thus be supplied, for example, while another substrate is printed onto and a third substrate is removed. The conveying means lie next to one another, so that the conveying directions or the conveying lines, respectively, or paths, run parallel to one another through the printing device or over the printing table. Due to the fact that the squeegee means has a squeegee, which can be moved over each printing nest, the substrates deposited or arranged, respectively, on the respective printing nest can be printed onto successively by means of the one squeegee. This means that only one squeegee means or one squeegee means comprising only one squeegee, respectively, is necessary in order to operate all printing nests of the printing table. The printing nests thereby advantageously lie one behind the other in a row, which follows the direction of movement or main direction of movement of the squeegee accordingly. One substrate after the other can thus be printed onto by means of a simple squeegee movement. Due to an advantageous control of the conveying means and squeegee means, an even flow of substrates through the printing device can thus be ensured, which leads to a temporally even output of substrates, which have been printed onto. A high substrate throughput is thus ensured by means of the printing device on the one hand, and an even substrate output on the other hand.

The squeegee means preferably has at least one printing screen, which has a screen frame, which supports a screen. In connection with the present invention, a printing screen is to also be understood as a print mask. Print mask and printing screen each have regions (printing patterns), which are permeable and non-permeable for the printing composition, in particular in the screen, by means of which the desired print image is generated on the respective substrate during a squeegee process. The printing screen is thus advantageously arranged above the printing nests.

According to the invention, at least one sensor means for detecting the position of a substrate arranged on the respective printing nest is assigned or can be assigned to each printing nest, wherein at least one controllable adjusting means for aligning printing screen and substrate to one another is assigned to printing nest, the printing table, and/or the squeegee means. A correct alignment of substrate and printing screen to one another is ensured by means of the adjusting means and the sensor means. To detect the position and/or alignment, markings, so-called fiducials, are preferably placed on the substrates, which provide for an optical detection of the position and alignment of the substrates. The position of the substrates, which are each positioned on the printing nests, can thus be detected relative to the printing screen by means of the at least one sensor means. For this purpose, the sensor means is formed, for example, to detect the substrate located on the bottom as well as the printing screen located thereabove, preferably optically, in order to determine the position and alignment thereof to one another. By controlling the adjusting means, the respective substrate can be positioned and aligned to match the printing screen. For this purpose, the adjusting means is formed, for example, to move the printing table as a whole. Even though all printing nests and the substrates located thereon are also moved thereby, this is possible in the squeegee pauses or at that moment, at which the squeegee is transferred from one printing nest to the next printing nest, due to the sequential squeegee process, which leads from one printing nest to the next, without a squeegee process being interrupted thereby, a squeegee result being negatively impacted, or the conveying of a substrate onto the printing table or from the printing table at another conveying means of the printing table being obstructed. If the adjusting means is assigned to the squeegee means in order to carry it out for the adaptation of the printing screen to the substrate to be printed onto, the same advantages follow. Optionally, an adjusting means is additionally assigned to the respective printing nest in order to position the respective printing nest and thus the respective substrate to the printing screen individually and independently of the remaining substrates.

The respective adjusting means preferably has at least one controllable actuator for moving the printing table, printing nest and/or the printing screen. The actuator is in particular a pneumatic, hydraulic, electromotive, electromechanical, or electromagnetic actuator. The adjusting means preferably has several actuators in order to provide for a movement of the printing table, printing nestand/or of the printing screen in different directions. The adjusting means is in particular formed in such a way that it can shift the respective element, thus printing table printing nest and/or printing screen, in at least two different directions in one plane and rotate it about a vertical axis, which is in particular aligned perpendicular to the plane. The adjusting means is optionally formed in such a way that it also provides for a tilting of the respective substrate or of the printing table, respectively, printing nestand/or the printing screen. According to a particularly preferred embodiment of the invention, the adjusting means is assigned at least or solely to the printing screen in order to align the latter in particular as a function of the position and/or alignment of the substrates to be printed onto.

According to a preferred further development of the invention, a control means is present, which is connected to the sensor means and to the at least one adjusting means for the control thereof and which is specifically made to align the respective substrate to be printed onto and the printing screen to one another by controlling the at least one actuator or the at least one adjusting means, respectively, for a printing process. This results in the already mentioned advantages.

The sensor means particularly preferably has at least one camera means for detecting a substrate on a printing nest. An optical detection of a substrate and optionally also of the printing screen is thus ensured. The optical detection of the actual position and alignment for setting the correct arrangement of printing screen and substrate to one another is already used successfully in other printing devices. A known technique can thus be resorted to. It is advantageous here that the known detection technique is used in a printing device, in the case of which several conveying paths exist, which are operated only by one squeegee. If only one camera means is present, a sequential detection or a successive detection of the substrates takes place, respectively. Several camera means are optionally present, so that a simultaneous detection, in particular of the substrate position, is possible at several printing nests. At least one camera means is particularly preferably assigned to each printing nest in order to detect the arrangement and alignment of a substate on the respective printing nest.

It is optionally provided that the sensor means has at least one displaceable camera means, which can be moved to each printing nest in order to successively detect the alignment of the substrates in the respective printing nest. Due to the provision of a displaceable camera means, the plurality of the individual camera means can be reduced significantly, in particular down to a single camera means, so that the production costs or the number of the individual parts, respectively, is reduced. For this purpose, a movable support means is preferably assigned to camera means, such as, for example, a robot arm or a rail system, which supports the camera and along which the camera means can be shifted, in particular Gantry system.

According to a preferred further development of the invention, the sensor means in each case has at least one, in particular stationary, camera means for each of the printing nests. The respective camera means is in particular integrated in the corresponding printing nest, so that the printing nest, together with the sensor means, forms a unit, which simplifies the assembly printing device.

The control means is preferably made to control the sensor means in such a way that the position and alignment of a substrate on a printing nest is detected before the squeegee reaches this printing nest. The control means is in particular made to detect the position of a substrate on a printing nest, while a substrate is printed onto on a different, in particular on an adjacent, printing nest. The control means is preferably additionally made to control the adjusting means assigned to the printing table or the printing screen only after or prior to a printing process, thus not during a printing process, but, for example, between two consecutive printing processes. It is thus ensured that the substrates are not changed in their position or alignment during a printing process.

The respective printing nest preferably has a lifting device, by means of which the substrate to be printed onto can be raised in the direction of the printing screen. The substrates can be raised individually in the direction of the printing screen by means of the lifting device in order to set a predetermined off contact distance or distance, respectively, between printing screen and substrate surface to be printed onto. By assigning a lifting device to each printing nest, it is ensured that the distance of the printing table remains the same even to the printing screen during a printing process, which in particular provides advantages with regard to the conveying means, which then do not have to compensate for any height differences.

It is furthermore preferably provided that the camera means is formed to be displaceable in such a way that it can be retracted between printing table and printing screen to detect the alignment and/or position of a substrate and can be displaced next to the printing table and printing screen to reach a non-use position. For detection purposes, the camera means thus moves between printing screen and printing table, while it is arranged next to printing table and printing screen, thus spaced apart from the two and so as not to lie in the intermediate space, in particular during a squeegee process. It is thus ensured that printing compound, which may detach from the printing screen, is not inadvertently applied to the camera means.

The respective printing nest preferably has means for fixing a substrate to be printed onto. By fixing the substrate to be printed onto it is ensured that the substrate does not shift during the squeegee process or changes in its alignment. The printing quality is permanently maintained thereby. The fixing means have, for example, a controllable clamping device, which cooperates with the side edge of a substrate and/or which presses the substrate onto a bottom of the printing nest for fixation purposes, or a vacuum or suction device, respectively.

According to a preferred embodiment of the invention, the squeegee means has a single printing screen, which extends over all printing nests and which has a printing pattern for each printing nest. Several printing patterns, which can be formed identically or differently, are thus present in the printing screen, whereby each printing pattern is assigned to one of the printing nests. The squeegee can thus be easily moved over the printing patterns in order to print successively onto the substrates in the printing nests.

According to an alternative embodiment-which is not in accordance with the invention-, it is provided that the squeegee means has a separate printing screen comprising a printing pattern for each printing nest. As standard, each printing screen has a frame, which supports or holds the actual screen. The frame serves the purpose of arranging and fastening the printing screen to the squeegee means and is formed, for example, in such a way that the printing screen is also held or can be held on the squeegee means so as to be capable of being exchanged. If the squeegee means has a printing screen for each of the printing nests, this results in that frame sections of the printing screens, which generally protrude from the respective printing pattern in height, lie between adjacent printing patterns. The adjacent printing patterns are thus separated from one another by means of the frame sections, whereby it is ensured that printing compound, which was applied to one of the printing screens, does not inadvertently reach onto the adjacent printing pattern. An advantageous separation of the adjacent printing patterns to one another is thus created. This embodiment also makes it possible that individual printing screens can be exchanged in order to exchange individual printing patterns or to adapt them to desired print images, respectively, without also removing the other printing patterns from the squeegee means for this purpose. For example, a printing screen can thus be removed, while a squeegee process takes place at an adjacent or a further printing screen of the squeegee means. A means for automatically inserting and removing one or several printing screens is in particular assigned to the squeegee means in order to provide for a simple exchange process of the one or a single one of the several printing screens.

It is furthermore preferably provided that the squeegee means has a flooding means, which is formed to flood the squeegee means, in particular the printing screen of the squeegee means, with the printing medium or with the printing compound, respectively, before a printing process is carried out by means of the movement of the squeegee. The printing medium, which is to be printed onto the substrates by means of the squeegee means, is thus provided by means of the flooding means. Due to the fact that the squeegee means is flooded with the printing medium prior to the movement of the squeegee, it is ensured advantageously that a printing process is carried out when moving the squeegee. The flooding means preferably has a flood squeegee, which serves the purpose of evenly distributing the printing medium on the printing screen or the printing stencil.

The method according to the invention is characterized in that the substrates are each supplied along several conveying means, which are arranged side by side, to one of several printing nests, which are arranged side by side-viewed in the conveying direction of the conveying means-, are printed onto successively by means of the squeegee means and are removed. It is in particular provided thereby that a substrate, which is printed onto, is already removed before the remaining substrates have also been printed onto by means of the squeegee means. This results in a continuous processing of the substrates, whereby the above-mentioned continuous processing or provision, respectively, of substrates, which are printed onto, results. In particular, each substrate, which is printed onto, is removed from the respective printing nest after the printing process and optionally a hardening pause and is further transported by means of the conveying means, independently of whether or not a squeegee process is or has already been carried out on the adjacent printing nest.

Prior to printing onto each substrate, the arrangement and alignment thereof is preferably detected with the help of a sensor means, as already described above, and the position and alignment of the substrate is adapted to the position and alignment of the printing screen. For this purpose, in particular one or several adjusting means are controlled, which are assigned to the printing table printing nest and/or the printing screen. The position and alignment of the substrates and/or of the printing screen is in particular detected with the help of at least one camera means, as already described above. The position on the printing nest is preferably detected before the squeegee reaches this printing nest to carry out a printing process. The position of a substrate on the printing nest is in particular detected promptly after the positioning thereof on the printing nest, independently of how far the squeegee is spaced apart from the printing nest to carry out a printing process.

Particularly preferably, the position of a substrate is detected on a printing nest while a substrate is printed onto on a different, in particular on an adjacent printing nest. This thus results in to a simultaneousness of method steps, by means of which the throughput of the printing device is further increased.

Particularly preferably, the one or the respective adjusting means is controlled only between two consecutive printing processes or partial printing processes, thus in particular in the time span, in which the squeegee does not carry out a printing process or in which the squeegee is transported from one printing pattern to the next printing pattern, respectively. It is in particular provided thereby that the position and alignment of all substrates is detected first, and that the one or the several adjusting means are controlled only when the squeegee lies between two printing patterns or in front of the first printing pattern, which is to be used. Preferably, only that substrate, the assigned printing pattern of which the squeegee passes over next, is always aligned. For example, the adjusting means for aligning the second substrate to be printed onto is thus controlled only when the squeegee has already completely swept over the printing pattern assigned to the first substrate and has not yet reached the following printing pattern. To carry out a squeegee process, the respective printing nest is preferably additionally raised by means of a lifting device, the printing screen is lowered in the direction of the substrate and/or the printing table is raised in the direction of the printing screen, in particular in order to set a predetermined off contact distance.

According to a preferred embodiment of the invention, the substrates are initially printed onto successively by means of the squeegee means in that the squeegee means, in particular the printing screen, is initially flooded with a printing medium and the squeegee is subsequently moved successively from an initial position in a direction over all printing nests in order to carry out a printing process. The substrates, which are arranged on the printing nests, are thus printed onto within a short time. A precise printing onto all substrates is ensured by means of the advantageous detection of the position and alignment of the substrates by means of the one or several adjusting means.

The squeegee is preferably subsequently moved back into the initial position over all printing nests. The squeegee means is thus guided back into its initial state again and a further printing process can take place.

It is optionally preferably provided that when moving the squeegee means backwards, the printing screen, in particular the screen fabric, or a printing stencil is flooded again with printing medium and in particular with the help of a flood squeegee, which is used for the return path of the squeegee means, so that a further printing process can be carried out immediately afterwards without standstill of the squeegee unit, aside from an optionally short standstill during the change of direction. A printing process is thus in each case carried out over all printing nests during the forwards as well as backwards movement of the squeegee. The throughput of the printing device is increased thereby. The printing device is in particular controlled in such a way that the substrates, which have already been printed onto once, are printed onto a second time during the backwards movement, for example in order to increase the printing height on the respective substrate. For this purpose, the conveying means are not controlled prior to the backwards movement, so that the substrates remain on the printing nests.

Alternatively, the conveying means are preferably controlled to each transport a substrate, which has been printed onto, away out of the printing nest and to transport a substrate, which is to be printed onto, onto the printing nest before the squeegee is moved backwards. New substrates are thus printed onto by means of the printing device when moving the squeegee backwards, whereby the throughput of the printing device is likewise increased. Whereby the substrates and the printing screen are also aligned to one another, as described above, prior to the backwards movement of the squeegee.

BRIEF DESCRIPTION OF THE DRAWINGS

Further advantages and preferred features and feature combinations follow in particular from that, which has been described above, as well as from the claims. The invention will be described in more detail below on the basis of the drawing, in which

DESCRIPTION OF EXAMPLE EMBODIMENTS

Figure 1:
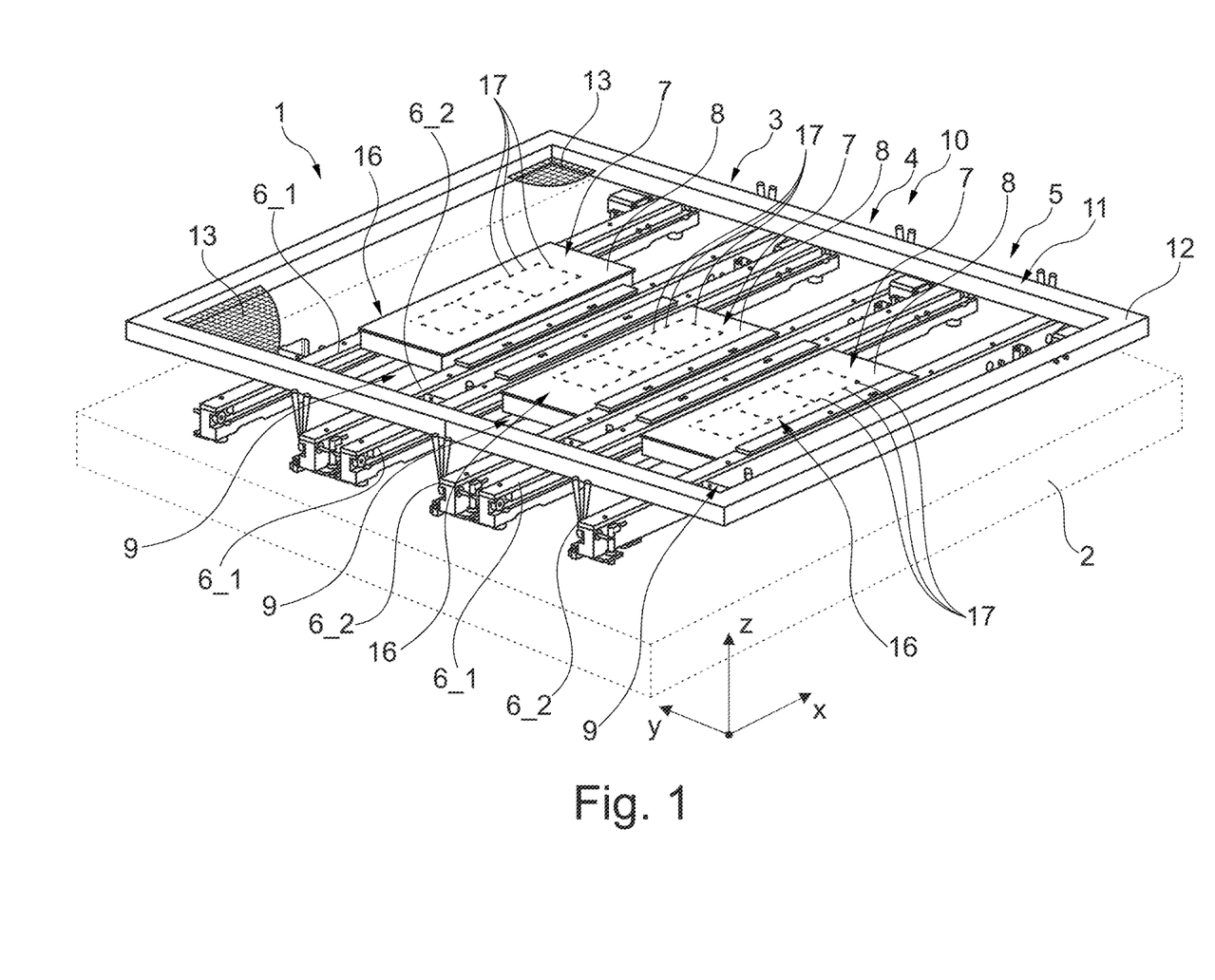
FIG. 1 shows an advantageous printing device in a simplified perspective illustration.

In a perspective illustration, FIG. 1 shows an advantageous printing device 1 for printing onto flat or planar substrates, respectively, such as, for example, wafers, printed circuit boards, or solar cells. In the present case, the printing device 1 has a printing table 2, on which several, in the present case three, conveying means 3, 4, 5 are arranged side by side and aligned parallel to one another. Each conveying means 3, 4, 5 has two conveyor belts 6_1 and 6_2, which are arranged parallel to one another and spaced apart from one another. The distance of the conveyor belts 6_1, 6_2 is thereby selected in such a way that a substrate to be printed onto can bear on the conveyor belts on its side edges. By driving the conveyor belts, the substrates lying thereon can be transported over the printing table along the respective conveying means 3, 4, 5. A printing nest 7, to which the substrate can be fixed, is arranged approximately in the middle of the longitudinal extension of the respective conveying means 3, 4, 5. According to the present exemplary embodiment, the respective printing nest 7 has a substrate support 8, which lies between the two conveyor belts 6_1, 6_2. The substrate support 8 in in particular in each case formed as a flat plate, onto which the respective substrate can be deposited.

The respective substrate support 8 can preferably be displaced in the height by means of a lifting device 9 in such a way that, in an initial position, it lies at the height of the transport belt 6_1, 6_2 or just below it, and, in a further position, raises the substrate to be printed onto from the transport belts 6_1, 6_2, so that it is released from the transport means 3, 4, 5. This is shown in an exemplary manner in FIG. 1 in such a way that the substrate support 8 of the conveying means 3 is raised, while the substrate supports 8 of the transport means 4, 5 are located in their base position, in which a substrate can be pushed onto the substrate support 8 by means of the respective conveying means.

A squeegee means 10, of which only a printing screen 11 is shown in FIG. 1, is arranged above the printing table 2 and thus spaced apart from the conveying means 3, 4, 5. The printing screen 11 has a screen frame 12, which supports a screen fabric or screen 13 (only shown in some regions in FIG. 1 for the sake of clarity). The screen 13, however, fills the entire screen frame 12.

Figure 2:
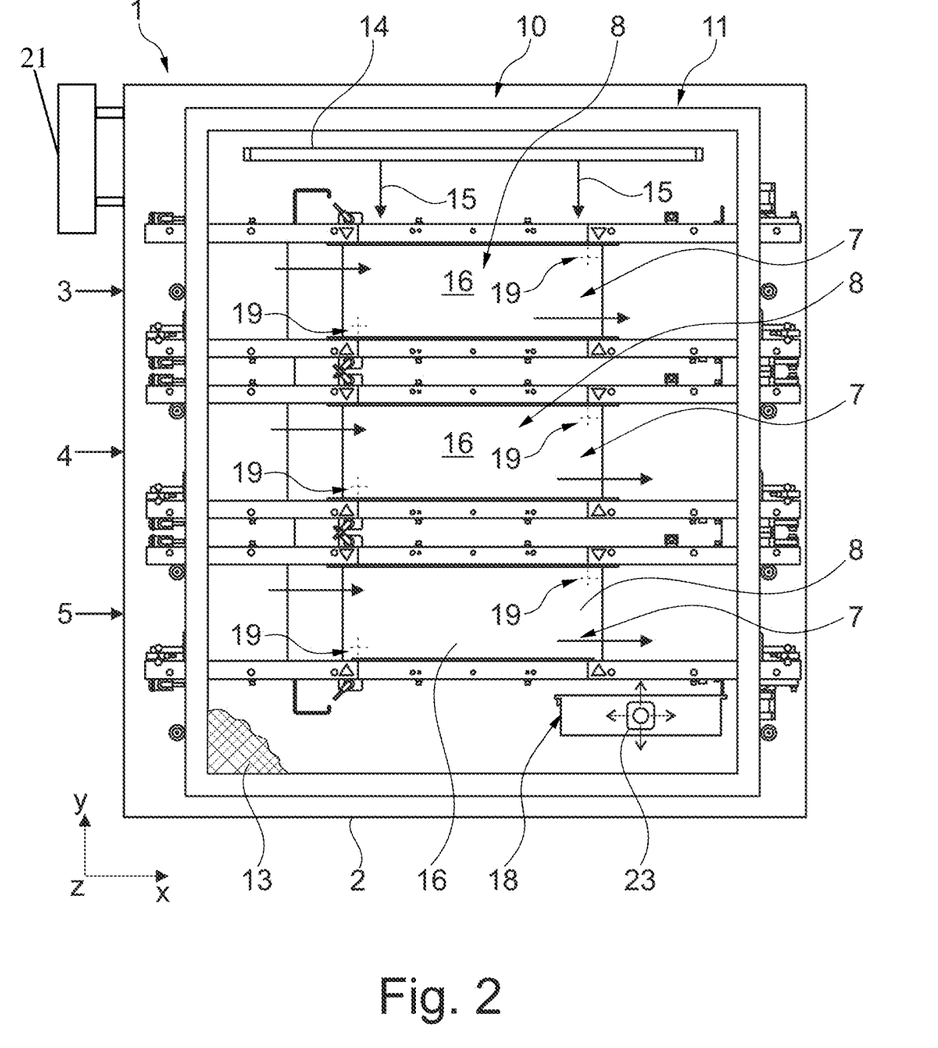
FIG. 2 shows the printing device in a simplified top view.

FIG. 2 shows a simplified top view onto the printing device 1 from FIG. 1. Already mentioned elements are provided with the same reference numerals in the following figures.

According to the present initial example, the transport means 3, 4, 5 protrude beyond the screen frame 12 on one side. According to a further exemplary embodiment, which is not illustrated here, the transport means 3, 4, 5 lie completely within the frame 12. Size and length of the screen frame 12 with regard to the conveying means 3, 4, 5, however, is less relevant. It is important that the screen frame 12 encompasses at least the region, in which the printing nests 7 of the conveying means 3, 4, 5 are located.

The squeegee means 10 furthermore has a displaceable squeegee 14, which, on its free end facing the printing screen 11, in particular has at least one squeegee blade, which can be swept over the screen 13. The direction of movement of the squeegee is thereby shown by means of arrows 15 in FIG. 2. The squeegee 14 can be moved in such a way that it can be successively guided over the printing nests 7 of the conveying means 3, 4, 5, so that substrates fixed to the printing nests 7 are successively printed onto. For this purpose, three substrates 16 are shown in an exemplary manner in FIG. 2, whereby one of the substrates 16 is in each case arranged and fixed to each of the printing nests 7.

Each printing nest 7 has its own fixing means. According to the exemplary embodiment of FIG. 1, the respective fixing means is formed as vacuum means, which has several suction openings 17, which are formed in the substrate support 8 and which are connected to a suction pump or suction means. The suction openings 17 are optionally connected to a common suction channel, which leads to the suction pump. At least one controllable valve is in particular arranged in the common suction channel in order to turn on and turn off the suction effect or pulling effect, respectively, of the suction openings 17 of a printing nest 7, if necessary. A substrate deposited on the substrate support 8 can thus be fixed to the substrate support 8 by means of the low pressure generated by means of the suction pump. It is ensured thereby that the substrate, once arranged, is not shifted or rotated during a squeegee process.

The screen 13 has a separate printing pattern for each printing nest 7. This means that the printing patterns can be formed identically or can be formed differently for all printing nests 7.

The printing device 1 furthermore has a sensor device 18, which serves the purpose of detecting the arrangement of a substrate on a printing nest 7. Advantageously, the substrates 16 will be or are provided with optical markings (fiducials), as shown in an exemplary manner in FIG. 2. The markings 19 are plotted there, for example, in the form of crosses on the top side of the respective substrate 16 facing away from the substrate support 8. The markings can be colored markings or can be designed by means of a relief in the surface of the substrate 16.

Figure 3:
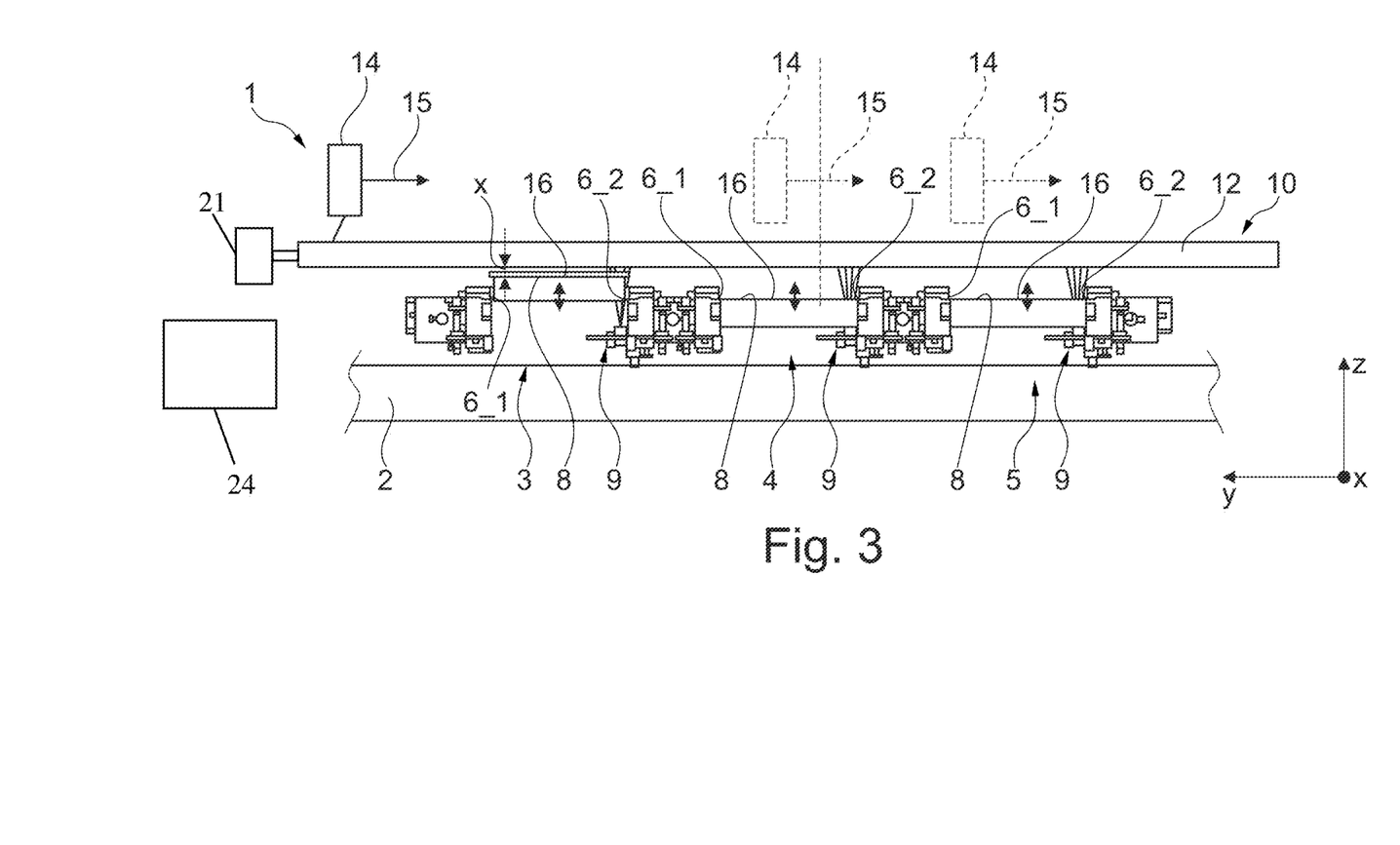
FIG. 3 shows the printing device in a simplified side view.

FIG. 3 shows the printing device 1 in a simplified side view, in which in particular the raised substrate support 8 of the conveying means 3 can be seen. By raising the substrate, a predetermined distance x between printing screen 11 and substrate 16 is additionally set, which defines the so-called off contact distance between screen and the surface of the substrate 16 to be printed onto. The off contact distance is selected in such a way that an optimal print image results on the substrate 16. Due to the fact that the squeegee 14 is moved over the conveying means 3, 4, 5 or the printing nests 7, respectively, transversely to the conveying direction of the conveying means 3, 4, 5 by means of one or several squeegee blades, that substrate 16, which is to be printed onto next, is always raised.

The printing device 1 furthermore has at least one adjusting means 21, as shown in an exemplary manner in FIG. 2, which, according to the present exemplary embodiment, is assigned to the printing table 2 and is formed to shift the printing table 2 in the printing table plane in at least two directions (x and y direction) and in particular in order to pivot it about a vertical axis z, which is aligned perpendicular to the printing table plane 2.

According to an exemplary embodiment, the mode of operation of the printing device is as follows:

Substrates 16 to be printed onto are conveyed in the direction of the printing nests 7 by means of the conveying means 3, 4, 5 and are fixed to the respective printing nest 7. The substrates can thereby be supplied to the printing nests 7 in parallel or successively by means of the conveying means 3, 4, 5. The substrate 16 supplied first or the substrate 16 lying in the foremost conveying path or conveying means 3, respectively, is detected by means of the sensor means 18, and its alignment and position to the assigned printing pattern of the printing screen 11 is detected. For this purpose, the sensor means 18 preferably has a camera means 23, which is formed to be displaceable in such a way that it can be moved between printing screen 11 and printing table 2 or conveying means 3, 4, 5, respectively, so that the markings 19 of the substrates 16 can be detected by means of the camera means 23. The camera means 23 is in particular also formed to detect the position of the printing screen 11. The camera means 23 is arranged on the printing table 2, for example by means of a Gantry system or drive, so that the camera means 23 can be displaced freely in order to detect all markings 19. In a non-use state, the camera means 23 can be displaced next to printing table and printing screen, so that it lies protected outside of the printing device or at least essentially outside of the printing device 1.

A control means 24 is present, which is connected at least to the sensor means 18 and to the adjusting means 21, in order to evaluate the detected position and alignment of the substrates 16 or in order to determine correction values, respectively, which are necessary to reach a predetermined position relative to the printing screen 11 in order to reach the predetermined position. As a function of the determined correction values, the control means 24 controls the adjusting means 21 to move the printing table 2 in such a way that the substrate 16, which is to be printed onto first, is aligned correctly to the printing pattern of the printing screen 11 assigned to it. The squeegee means 14 is controlled only subsequently by the control means 24 to carry out the printing process at the first substrate 16 at the conveying means 3.

In the next step, the control means 24 controls the sensor device 18 again to detect the position and alignment of the substrate 16, which is to be printed onto next, in this case the substrate 16 of the conveying means 4, relative to the printing screen 11, and to determine correction values. After detecting or determining the correction values, the adjusting means 21 is controlled again to move the printing table 2 in such a way that the substrate 16 of the conveying means 4 is aligned correctly to the printing screen 11 for the preceding printing process. The squeegee 14 is moved further to the conveying means 4 only subsequently in order to print onto the substrate 16, which is located in the printing nest 7 there. The process is carried out accordingly when printing onto the substrate 16 in the printing nest 7 of the conveying means 5. The substrates 16 are subsequently removed from the printing table 2 by means of the conveying means 3, 4, 5 and new substrates 16 are supplied to the printing nests 7.

The control means 24 is preferably formed in such a way that a substrate, which is printed onto, is removed from the printing table 2 as soon as it was printed onto. Substrates can thus be printed onto, supplied, and removed at the same time.

The alignment and position of the substrates 16 positioned on the printing nests 7 is preferably detected before the start of the first printing process by means of the sensor means 18, and the printing screen 11 is then preferably adjusted for adaptation to the position and alignment of the respective substrate prior to the respective printing process or partial printing process. Alignment and position of all substrates, which are to be printed onto, are thereby detected in or on the printing nests before the squeegee is moved over the printing screen 11 for carrying out a printing process. The alignment or correction of the alignment, respectively, by means of the adjusting means 21 preferably only takes place prior to or after a printing process, for example in the printing pauses between two consecutive printing processes.

Alternatively to the displaceable camera means 23, it is provided according to the further exemplary embodiment that at least one camera means is assigned to each printing nest 7.

Figure 4:
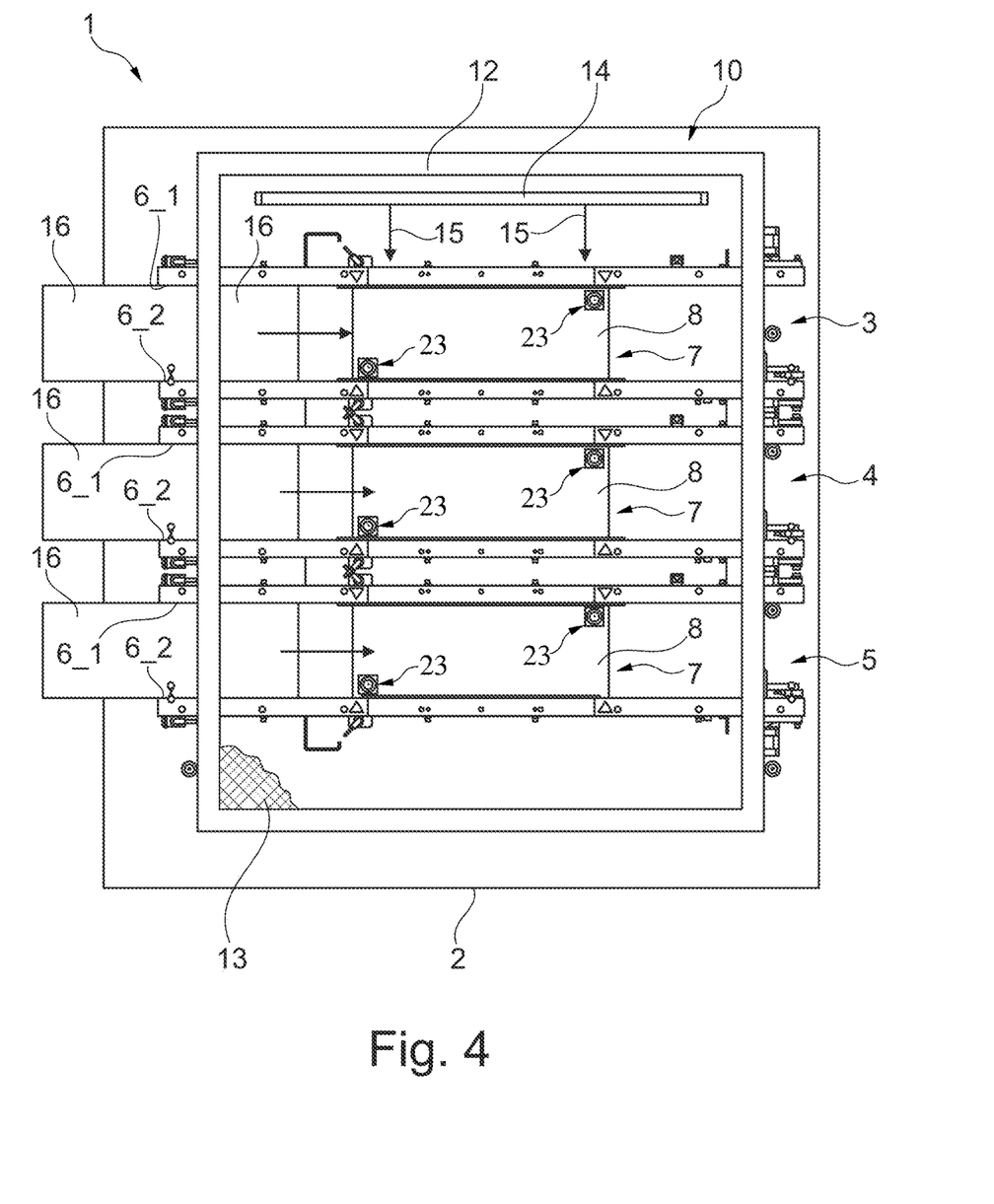
FIG. 4 shows the advantageous printing device according to a further exemplary embodiment in an advantageous top view.

For this purpose, FIG. 4 shows a further top view onto the printing device 1 according to the further exemplary embodiment. In contrast to the preceding exemplary embodiment, several camera means 23 are assigned to each printing nest 7. The number of the camera means 23 thereby in particular corresponds to the number of the markings 19 on the substrate 16, which is to be detected in each case. The camera means 23 are thereby fixedly or firmly mounted to the respective printing nest 7, respectively, so that a mechanism or drive technique for displacing the camera means 23 is forgone. A prompt detection of the position and alignment of the respective substrate 16 is ensured in an advantageous manner by means of the several camera means 23. Position and alignment several substrates 16 can in particular also be detected simultaneously.

According to a further exemplary embodiment, it is provided that the respective printing nest 7 is not equipped with a lifting device but that the entire printing table 2 is instead raised in the z direction and/or the printing screen 11 is lowered in the z direction in order to set the desired off contact distance between the substrate to be printed onto and the printing screen 12.

Alternatively or additionally, the adjusting means 21 is assigned to the printing screen 11, as shown in an exemplary manner in FIG. 3, so that the printing screen 11 can be shifted in the x-y plane or can be raised and lowered in the z direction, and/or in can be pivoted about an axis in particular parallel to the z direction by means of said adjusting means in order to precisely set the assignment or positioning, respectively, of the respective printing pattern to the respective substrate 16, which is to be printed onto.

The correcting of the alignment and position of the respective substrate 16, which is to be printed onto, takes place within that period of time, in which the squeegee is moved from the substrate, which was printed onto previously, to the substrate, which is to be printed onto. No time is thus lost and a high through-through through the printing device 1 is ensured. The squeegee speed is particularly preferably selected in such a way that the squeegee can be pulled over all printing nests 7 without interruption from one end of the printing screen to the other end of the printing screen, whereby the adjusting processes for the correction of the alignment and position of the substrate, which is to be printed onto in each case, then take place at that moment, at which the squeegee is pulled over a region of the printing screen 11, which is impermeable for the printing compound. Such a region is preferably in each case formed between the adjacent printing patterns of the printing screen 11. If the time for correcting the alignment and/or position of the respective substrate 16 is not sufficient, the squeegee process is preferably interrupted until the respective substrate 16 is aligned correctly. While according to the present exemplary embodiment only three conveying means and thus only three conveying paths are present, the number of conveying means can be increased arbitrarily, so that printing devices with 4, 5, 6 or more conveying means and a corresponding number of conveying paths is also conceivable.

Mechanical fixing means, such as, for example, clamping means, can also be used alternatively to the vacuum means 17.

The squeegee means preferably has a flooding means, by means of which the printing medium can be applied to the printing screen 11. Prior to carrying out a printing process, the printing screen 11 is flooded with the printing medium by means of the flooding means, so that sufficient printing medium is present on the printing screen 11, which can be applied by means of the squeegee 14 through the screen 13 onto the substrates 16, which are to be printed onto, in one printing process.

According to an exemplary embodiment, the substrates 16 are transported away from the printing nests 7 over all printing nests 7 after a printing process has taken place, and new substrates, which are to be printed onto, are placed on the printing nests 7.

According to a further exemplary embodiment, the substrates 16 are left in the printing nests over all printing nests 7 after a printing process has taken place, and the squeegee 14 is moved over the printing nests again, but this time in the opposite direction, in order to carry out a further printing process.

According to yet a further exemplary embodiment, the substrates are replaced by new substrates, which are to be printed onto, prior to moving the squeegee 14 back into its initial position by means of the conveying means 3, 4, 5, so that the new substrates 16 are now printed onto when moving back the squeegee 14, in particular after the printing screen 11 was flooded again, as described above. The throughput of the printing device 1 is increased significantly thereby.

The invention claimed is:

1. A printing device for printing onto substrates, comprising:
   a squeegee means;
   at least one printing table;
   wherein the squeegee means is arranged above the at least one printing table;
   the printing table further comprising several conveying means which are arranged side by side and in parallel to one another and each having at least one printing nest such that a substrate can be transported in each case to each printing nest below the squeegee means and out of the printing nest after a printing process has taken place;
   wherein the squeegee means further comprises a single printing screen which extends over all of the printing nests and which has a printing pattern for each printing nest, and wherein the squeegee means has at least one squeegee which can be moved over each printing nest in order to print successively onto the substrates which are arranged in the printing nests;
   the printing device further comprising:
   at least one sensor means for detecting the position and/or alignment of a substrate arranged in a respective printing nest being assigned to each printing nest, and
   at least one controllable adjusting means for aligning and/or positioning the respective substrate and the printing screen to one another being assigned to the printing table and/or the squeegee means,
   wherein a correcting of the alignment and/or position of the respective substrate and of the printing screen to one another takes place in that period of time, in which the squeegee is moved from a substrate, which has been printed onto previously, to a substrate, which is to be printed onto.

2. The printing device according to claim 1, wherein the single printing screen, which has a screen frame, which supports a screen.

3. The printing device according to claim 1, wherein the adjusting means has at least one controllable actuator for moving the printing table, printing nest and/or the printing screen.

4. The printing device according to claim 3, wherein a control means is connected to the sensor means and to the at least one adjusting means and is specifically made to align substrate and printing screen to one another by controlling the at least one actuator.

5. The printing device according to claim 1, wherein the sensor means has at least one camera means for detecting the position and/or alignment of a substrate on at least one of the printing nests.

6. The printing device according to claim 5, wherein the camera means is formed to be displaceable such that the camera means can be retracted between the at least one printing table and the single printing screen to detect the alignment and/or position of a substrate and can be displaced next to the at least one printing table and the single printing screen to reach a non-use position.

7. The printing device according to claim 1, wherein the sensor means has a displaceable camera means, which can be moved to each printing nest in order to successively detect the alignment and position of the substrates of all printing nests.

8. The printing device according to claim 1, the sensor means in each case has at least one, stationary camera means for each of the printing nests.

9. The printing device according to claim 1, wherein each printing nest has a lifting device, by means of which the substrate to be printed onto can be raised in the direction of the printing screen.

10. The printing device according to claim 1, wherein each printing nest has fixing means for locking a substrate to be printed onto on the respective printing nest.

11. The printing device according to claim 1, wherein the squeegee means has a flooding means, which is formed to flood the squeegee means, with a printing medium before a printing process is carried out by means of the movement of the at least one squeegee.

12. A method for operating a printing device according to claim 1 for printing onto substrates, the printing device comprising a squeegee means and at least one printing table; the method comprising:
    arranging the squeegee means above the at least one printing table;
    conveying a substrate to be printed onto a printing nest,
    printing onto, and subsequently transporting the substrate away from the printing nest, wherein the substrates are each supplied along several conveying means, which are arranged side by side, to one of several printing nests, which are arranged side by side, are printed onto successively by means of a squeegee of the squeegee means and are removed, wherein the squeegee means has a single printing screen, which extends over all printing nests and which has a printing pattern for each printing nest, and
    detecting by at least one sensor means the position and/or alignment of a substrate arranged on the respective printing nest, wherein the at least one sensor means is assigned to each printing nest,
    aligning and/or positioning the respective substrate and the printing screen to one another by at least one controllable adjusting means, wherein the at least one controllable adjusting means is assigned to the printing table and/or the squeegee means, and
    correcting an alignment and/or position of the respective substrate and of the printing screen to one another in that period of time, in which the squeegee is moved from a substrate, which was printed onto previously, to a substrate, which is to be printed onto.

13. The method according to claim 12, further comprising flooding the squeegee means with a printing medium, and subsequently moving the squeegee from an initial position in a direction over all printing nests in order to carry out a printing process, wherein the substrates are initially printed onto successively by means of the squeegee means.

14. The method according to claim 13, further comprising subsequently moving the squeegee back into the initial position over all printing nests.

15. The method according to claim 14, further comprising flooding the squeegee means with printing medium again before the squeegee is moved backwards, so that the squeegee carries out a further printing process when being moved backwards.

16. The method according to claim 15, further comprising controlling the conveying means to each transport a substrate, which has been printed onto, away out of the printing nest and to transport a substrate, which is to be printed onto, onto the printing nest before the squeegee is moved backwards.

* * * * *